(12) United States Patent
Leib et al.

(10) Patent No.: US 7,863,200 B2
(45) Date of Patent: Jan. 4, 2011

(54) PROCESS OF VAPOR DEPOSITING GLASS LAYERS FOR WAFER-LEVEL HERMETIC ENCAPSULATION OF ELECTRONIC MODULES

(75) Inventors: Jürgen Leib, Freising (DE); Dietrich Mund, Obersüssbach (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/511,566

(22) PCT Filed: Apr. 15, 2003

(86) PCT No.: PCT/EP03/03882

§ 371 (c)(1),
(2), (4) Date: Apr. 13, 2005

(87) PCT Pub. No.: WO03/087424

PCT Pub. Date: Oct. 23, 2003

(65) Prior Publication Data

US 2005/0227408 A1  Oct. 13, 2005

(30) Foreign Application Priority Data

| Apr. 15, 2002 | (DE) | ................. 202 05 830 |
| May 23, 2002 | (DE) | ................. 102 22 609 |
| May 23, 2002 | (DE) | ................. 102 22 958 |
| May 23, 2002 | (DE) | ................. 102 22 964 U |
| Nov. 13, 2002 | (DE) | ................. 102 52 787 U |
| Jan. 16, 2003 | (DE) | ................. 103 01 559 |

(51) Int. Cl.
*H01L 21/316* (2006.01)
*H01L 21/56* (2006.01)

(52) U.S. Cl. .................... 438/778; 257/E21.275; 257/E21.28; 257/E21.503

(58) Field of Classification Search ............. 438/26, 438/38, 64, 106, 125, 126, 127, 778, 783, 438/784, 958; 257/E21.271, E21.266, E21.274, 257/E21.275, E21.276, E21.277, E21.278, 257/E21.279, E21.28, E21.281, E21.503
See application file for complete search history.

(56) References Cited

U.S. PATENT DOCUMENTS

| 3,204,023 A * | 8/1965 | Harmon et al. ............. 174/535 |
| 4,001,049 A * | 1/1977 | Baglin et al. .............. 250/492.3 |
| 4,374,391 A * | 2/1983 | Camlibel et al. ............. 257/634 |

(Continued)

OTHER PUBLICATIONS

Glass Dynamics webpages for selected Corning Glasses. 7 Pages total.*

*Primary Examiner*—Sara Crane
*Assistant Examiner*—Andrew O Arena
(74) *Attorney, Agent, or Firm*—Ohlandt, Greeley, Ruggiero & Perle, LLP

(57) ABSTRACT

A process to encapsulate electronic modules in a manner which is substantially resistant to water diffusion yet is carried out at moderate temperatures below 300° C., preferably below 150° C. is provided. The process forms a housing for electronic modules, in particular sensors, integrated circuits and optoelectronic components. The process includes the steps of: providing a substrate, of which at least a first substrate side is to be encapsulated; providing a vapor-deposition glass source; arranging the first substrate side in such a manner with respect to the vapor-deposition glass source that the first substrate side can be vapor-coated; and vapor-coating the first substrate side with a glass layer.

26 Claims, 5 Drawing Sheets

U.S. PATENT DOCUMENTS

| | | | | |
|---|---|---|---|---|
| 4,492,717 | A * | 1/1985 | Pliskin et al. | 438/618 |
| 4,855,026 | A * | 8/1989 | Sioshansi | 204/192.11 |
| 4,889,960 | A * | 12/1989 | Butt | 174/52.4 |
| 5,047,369 | A * | 9/1991 | Fleming et al. | 438/779 |
| 6,111,270 | A * | 8/2000 | Xu et al. | 257/72 |
| 6,137,173 | A * | 10/2000 | Davis | 257/730 |
| 6,291,345 | B1 * | 9/2001 | Golecki et al. | 438/659 |
| 6,400,976 | B1 * | 6/2002 | Champeau | 600/374 |
| 2002/0019069 | A1 * | 2/2002 | Wada | 438/69 |
| 2005/0244949 | A1 * | 11/2005 | Miles | 435/287.1 |

* cited by examiner

PROCESS OF VAPOR DEPOSITING GLASS LAYERS FOR WAFER-LEVEL HERMETIC ENCAPSULATION OF ELECTRONIC MODULES

BACKGROUND OF THE INVENTION

1. Field of the Invention

The invention relates to a process for forming housings for electronic modules, and to electronic modules that are hermetically encapsulated in this way, in particular sensors, integrated circuits and optoelectronic components.

2. Description of Related Art

To encapsulate integrated circuits and optoelectronic components, it is known to use an organic adhesive layer to bond a thin plate of glass onto the module and thereby to cover and protect the sensitive semiconductor structures. This design has the drawback that over the course of time water can diffuse into the organic adhesive layer and can then reach and damage the semiconductor structures. Furthermore, the adhesive layers may age as a result of UV irradiation, which is damaging in particular to electro-optical modules.

As an alternative to organic adhesives, low-melting glass solder has also already been used as an intermediate layer which has been sprayed on, sputtered on or applied by means of screen-printing and dispenser technology. The process temperature for melting the glass-solder layer, however, is higher than T=300° C., which means that temperature-sensitive semiconductor structures cannot be encapsulated.

BRIEF SUMMARY OF THE INVENTION

The invention is therefore based on the object of providing a process for encapsulating electronic modules which makes it possible to achieve encapsulation which is substantially resistant to water diffusion yet is carried out at moderate temperatures below 300° C., preferably below 150° C.

One advantage of coating with a vapor-deposition glass is the application of the insulating glass layer at room temperature up to approximately 150° C., so that there is no likelihood of damage or oxidation of the substrate surface whatsoever, even with metal substrates. In this context, reference is also made to the following applications:

DE 202 05 830.1, filed on Apr. 15, 2002,
DE 102 22 964.3, filed on May 23, 2002;
DE 102 22 609.1, filed on May 23, 2002;
DE 102 22 958.9, filed on May 23, 2002;
DE 102 52 787.3, filed on Nov. 13, 2002;
DE 103 01 559.0, filed on Jan. 16, 2003;

in the name of the same Applicant, the content of disclosure of which is hereby expressly incorporated by reference.

With regard to the barrier properties of vapor-deposition glass layers, measurements have shown that with layer thicknesses of the vapor-deposition glass layer in the range from 8 μm to 18 μm, helium leak rates of less than $10^{-7}$ mbar l s$^{-1}$ or less than $10^{-8}$ mbar l s$^{-1}$ are reliably achieved. The measurements, for layers with a thickness of 8 μm and 18 μm have even revealed helium leak rates of between 0 and $2\times10^{-9}$ mbar l s$^{-1}$, and even these upper limit values are significantly influenced by the measurement inaccuracy of the tests carried out.

The process according to the invention for encapsulation with vapor-deposition glass can even be employed if the electronic module is attacked while it is still being produced. The thickening of the substrate of the electronic module produced by the vapor-deposited glass layer is utilized to stabilize the substrate while actions are being carried out on the substrate from the unencapsulated side. The otherwise finished electronic module may also be encapsulated from the connection side, leaving clear the connections themselves. For this purpose, the substrate may, for example, be provided with a passivation layer on the opposite side from a first side having the semiconductor structures. By way of example, a plastic layer is suitable for this purpose. The passivation layer may also comprise a glass layer which is preferably vapor-deposited onto this side.

The process is particularly suitable for packaging components which still form part of a wafer (wafer level packaging), in which case the substrate comprises a wafer having the substrates of the components, which can be separated from the wafer after they have been packaged.

Depending on the particular requirements, the thickness of the vapor-deposited glass layer may be from 0.01 to 1000 μm. If it is merely a matter of hermetically sealing the module to be protected, it is preferable for the glass layer thickness to be in the range between 0.1 and 50 μm. If the loads imposed are greater, the glass layer thickness is increased accordingly, with a preferred range for the glass layer thickness being between 50 and 200 μm. It is also possible to build up multiple layers in combination with other materials. It is, furthermore, possible for the glass layer to be combined with an applied plastic layer in order to structurally reinforce the electronic module.

There are various options for the vapor deposition of glass. It is preferable to generate the glass vapor from a stock glass target by means of electron beam. It is possible to generate vapor-deposition rates of more than 4 μm/min, and the glass produced is deposited with a secure bond on the surface of the substrate without needing an increased $H_2O$ content for a bonding action, as is the case with low-melting is glass solder. The preferred vapor-deposition glass is a borosilicate glass containing aluminum oxide and alkali metal oxide fractions, such as for example the vapor-deposition glass of type 8329 produced by Schott Glas. Moreover, this glass has a coefficient of thermal expansion which is close to that of the substrate for standard semiconductor structures or can be matched to the coefficient of thermal expansion of the substrate by suitable modification to the components. It is possible to use vapor-deposition glass of other compositions, in particular in a plurality of layers on top of one another, in which case the glasses of the layers may have different properties with regard to refractive index, density, hardness, etc.

The vapor-coating of the substrate with a glass layer may advantageously also encompass plasma ion assisted deposition (PIAD). In this case, an ion beam is additionally directed onto the substrate to be coated. The ion beam may be produced by way of a plasma source, for example by ionization of a suitable gas. The plasma results in additional densification of the layer and the removal of loosely adhering particles from the substrate surface. This leads to particularly dense, low-defect deposited layers.

Furthermore, by selecting a suitable combination of materials, it is possible to realize the application of a mixed layer of inorganic and organic constituents. This mixed layer is characterized by a reduction in its brittleness.

If the glass layer is applied to a first side of the substrate of the electronic module before this electronic module has been fully produced, it may be expedient, for handling purposes during completion of production, to apply a plastic layer, which reinforces the module, above the glass layer. In this case, the glass layer is produced with a thickness which is sufficient for encapsulation or hermetic seal with respect to the penetration of diffusing substances, while the plastic layer is produced in a thickness which is required for stabilization during further processing of the module.

In such a case, it is possible for material to be removed from the second, unencapsulated substrate side, so that it is possible to produce connections to the module which extend into the module from the underside and are therefore protected by the module itself when the module is finally installed at its position of use. This is of significance in particular in the case of sensors.

BRIEF DESCRIPTION OF THE SEVERAL VIEWS OF THE DRAWINGS

The invention is described with reference to the drawing, in which.

DETAILED DESCRIPTION OF THE INVENTION

Figure 10:
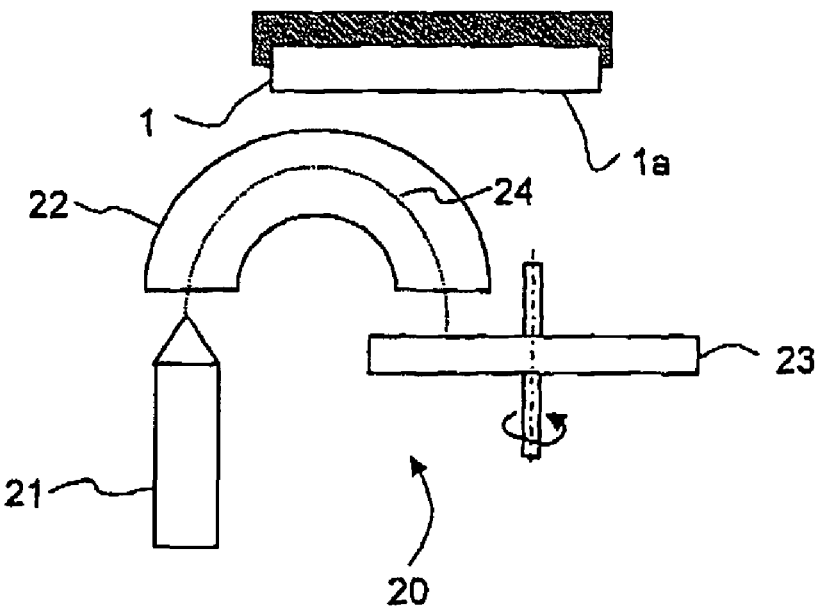
FIG. 10 shows a diagram illustrating a vaporization arrangement.

FIG. 10 shows the arrangement of a substrate 1 with respect to a vapor-deposition glass source 20 which comprises an electron beam generator 21, a beam-diverter device 22 and a glass target 23 on which the electron beam 24 impinges. At the location at which the electron beam impinges, the glass is vaporized and is then deposited on the first side 1a of the substrate 1. To allow the glass from the target 23 to be vaporized as uniformly as possible, the target is rotated and the beam 24 sweeps back and forth along it. In addition, the arrangement may also comprise a plasma source for generating an ion beam which, in operation, is directed onto the side 1a that is to be coated, in order for the substrate to be coated with a glass layer by means of plasma ion assisted deposition (PIAD).

Figure 1:
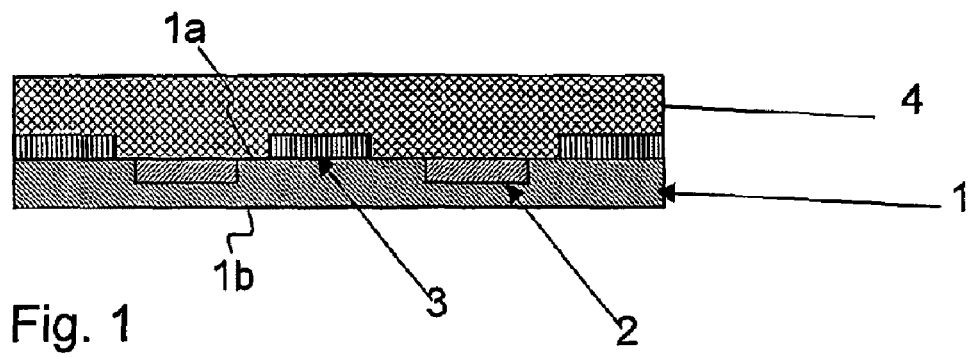
FIG. 1 shows a section through a wafer with a vapor-deposited glass layer.

For more details concerning the possible substrate 1, reference is made to FIG. 1. A silicon wafer as the substrate 1 includes regions 2 having semiconductor structures and regions 3 having connection structures, for example made from aluminum. The connection structures may, for example, comprise bond pads or other connection surfaces. The silicon wafer constitutes a substrate with a surface roughness of <5 µm. The top side 1a of the substrate is on the opposite side from the underside 1b. A glass layer 4, which has preferably been obtained from the vapor-deposition glass of type 8329 produced by Schott, has been deposited on the top side 1a. This type of glass can be substantially vaporized by the action of the electron beam 24, the work being carried out in an evacuated environment at $10^{-4}$ mbar residual pressure and a bias temperature during the vaporization of 100° C. Under these conditions, a dense, continuous glass layer 4 is produced, and this layer is substantially impermeable to gases and liquids, including water, but transmits light, which is important in the case of electro-optical modules.

The glass layer 4 may also include a plurality of individual layers, for example made from glasses with different compositions. The glass layer may also comprise a mixed layer formed from inorganic and organic constituents in order, for example, to achieve an increased layer flexibility.

The underside 1b of the wafer is available for further processing steps, which include wet, dry and plasma etching or cleaning.

If, as in FIG. 1 and the further FIGS. 2 to 9, the substrate used is a wafer, the process according to the invention may expediently be used to package components which still form part of a wafer. However, the process can also be applied in a similar way to chips which have already been separated from the wafer and comprise semiconductor structures and connection structures.

Figure 2:
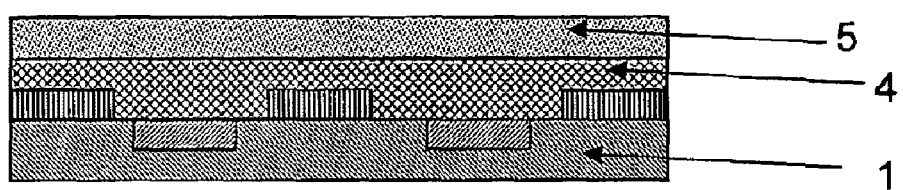
FIG. 2 shows a wafer section with glass and plastic layer.

FIG. 2 shows a covering layer for the substrate 1, comprising a glass layer 4 and a plastic layer 5. The glass layer 4 has a thickness in the range from 1 to 50 µm, which is sufficient for the encapsulation or hermetic sealing, while the plastic layer 5 is thicker, in order to impart greater stability to the wafer as a workpiece for subsequent treatment steps.

Figure 3:
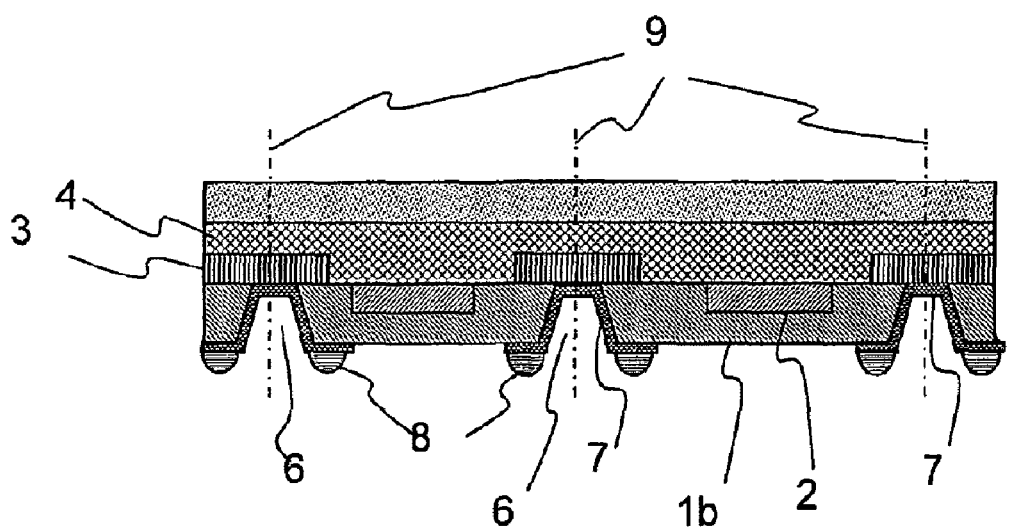
FIG. 3 shows the production of connections to the wafer.

FIG. 3 shows the further treatment of a wafer. The wafer is thinned on the underside, so that the components that can be produced in accordance with the invention have a thinned substrate, and etching pits 6 are produced, extending as far as the connection structures 3, which act as an etching stop. The wafer underside 1b is provided with a plastic lithograph, with the regions of the connection structures 3 remaining open. Then, line contacts 7 are produced on the underside, for example by spraying or sputtering, with the result that conductive layers 7 are produced in the region of the etching pits 6. Then, the plastic used for the lithography is removed from the wafer underside 1b. Next, a ball grid array 8 is applied to the conductive layers 7, and the wafer is divided along planes 9. The result is a plurality of electronic modules whose semiconductor structures 2 are safely embedded between the covering layer 4 and the substrate 1 such that they are hermetically sealed.

Figure 4:
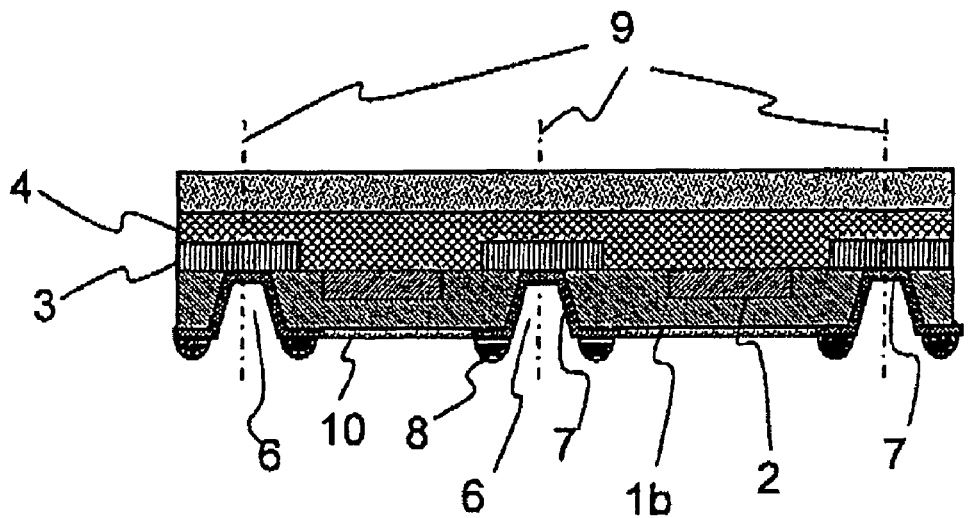
FIG. 4 shows the additional plastic passivation of the wafer underside.

FIG. 4 shows a modification to the embodiment shown in FIG. 3. The same process steps as those described above are carried out, but the plastic on the wafer underside 1b is not removed and covers the underside as a passivation and protective layer 10.

Figure 5:
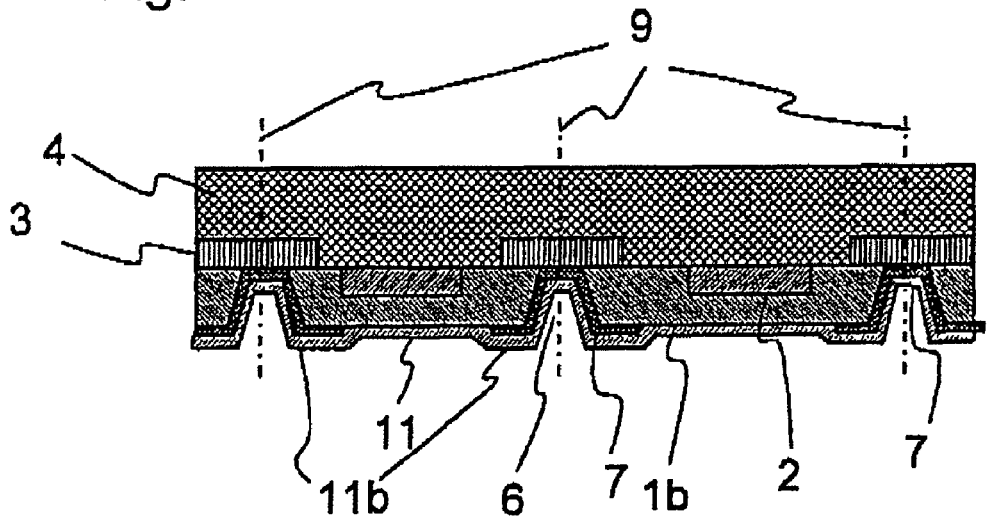
FIG. 5 shows the coating of the wafer underside with vapor-deposition glass.

FIG. 5 shows an embodiment in which a vapor-deposited glass layer 11 is to be applied to the underside 1b of the substrate instead of the plastic layer 10. As in the embodiment shown in FIG. 3, the plastic used for lithography is removed from the wafer underside 1b, and the entire underside 1b of the wafer is vapor-coated with the glass, producing a 1 to 50 µm thick glass layer 11.

The glass layer 11 shown in FIG. 5, like the plastic layer 10 illustrated in FIG. 4, serves as a protective or passivation layer.

Figure 6:
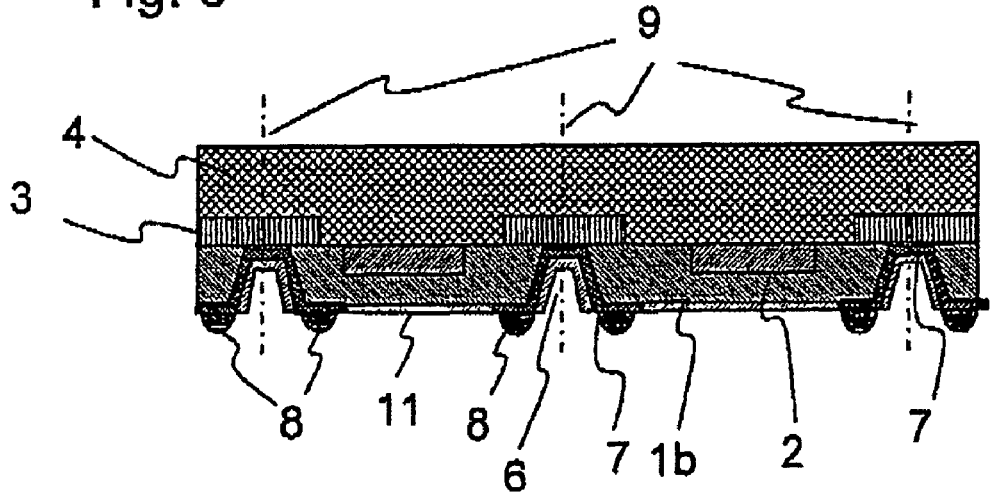
FIG. 6 shows the application of a ball grid array to the wafer shown in FIG. 5.

As illustrated at 11b, this glass layer also covers the outwardly projecting parts of the line contacts 7. To apply a ball grid array 8, these regions 11b are uncovered by being ground and/or etched away. Then, the ball grid arrays are applied, as shown in FIG. 6, and the wafer is then divided up in order to form individual modules, and indicated at 9. The sensitive semiconductor structures 2 are protected at the top and the bottom by a respective glass layer 4 and 11.

Figure 7:
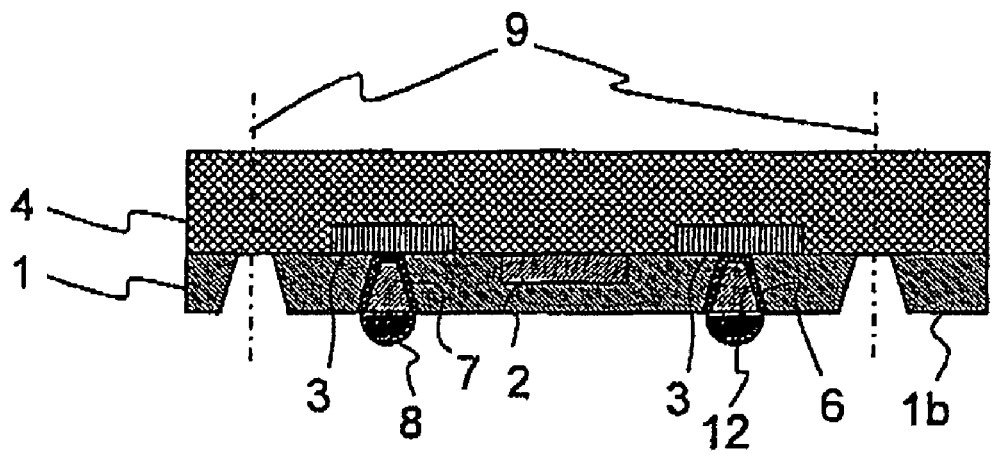
FIG. 7 shows a further way of applying the ball grid array.

In a further embodiment of the invention, the wafer is divided up at parting planes 9 which do not pass through the connection structures. This has the advantage that it is also possible to ensure a lateral passivation protection for the modules. FIG. 7 shows an example of dividing up the wafer which only affects material of the covering layer 4 and of the substrate 1. The procedure is initially the same as for the exemplary embodiments described above, i.e. the wafer is thinned from the underside and etching pits 6 which extend as far as the underside of the connection structures 3 are produced. The wafer underside 1b is lithographed, with the regions of the connection structures remaining open. The line contacts 7 are produced in the region of the etching pits 6, with the etching pits also being filled with conductive material 12. In this context, thickening by electroplating using Ni(P) may be considered. The components producible in accordance with this embodiment of the invention accordingly have through-contacts passing through the substrate.

After the plastic has been removed from the wafer underside at least in the region of the contacts 7, the ball grid arrays 8 are applied. This is followed by dividing up the wafer along planes 9. The result is electronic modules with hermetically sealed semiconductor structures 2, with an analogous plastic layer 10 being present or absent depending on the procedure employed.

Figure 8:
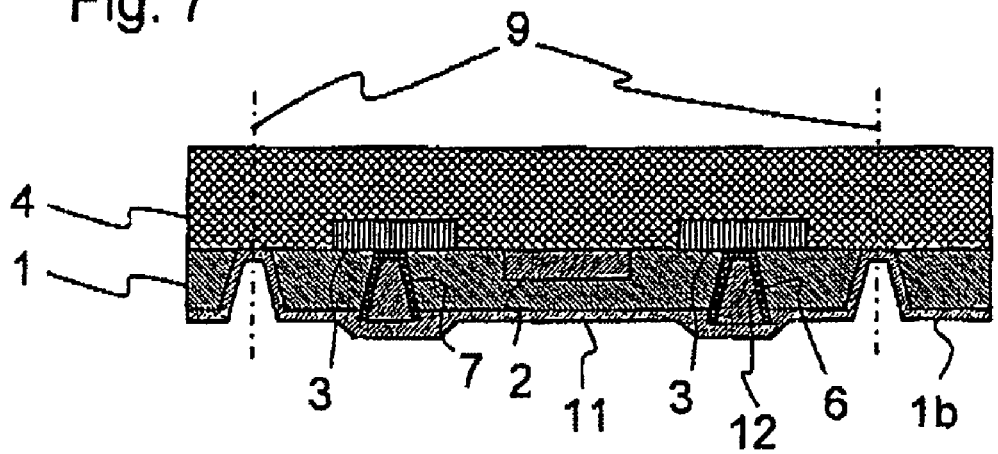
FIG. 8 shows the encapsulation of the underside of a wafer.
Figure 9:
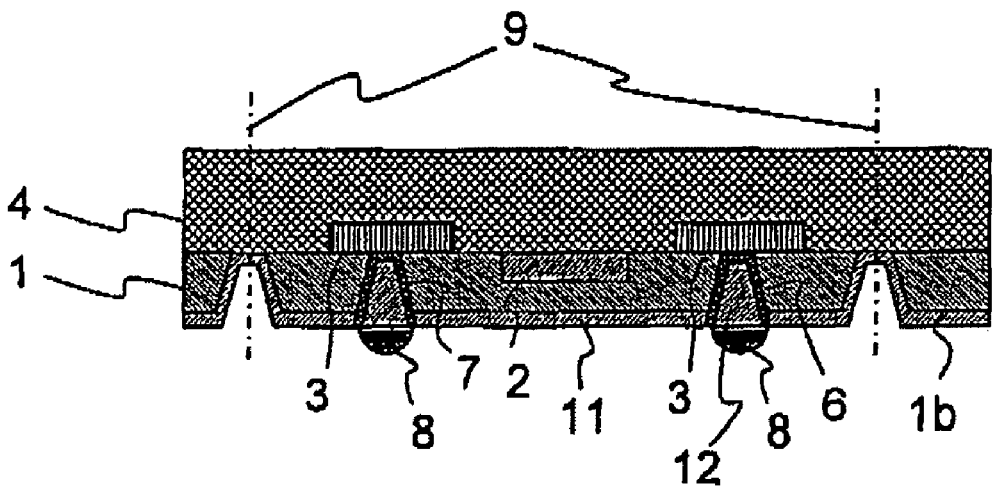
FIG. 9 shows the application of the ball grid arrays to the wafer shown in FIG. 8.

FIGS. 8 and 9 show an exemplary embodiment involving the production of a glass layer 11 on the underside. The procedure is similar to that of the embodiment shown in FIG. 5 in conjunction with FIG. 7, i.e. filled regions are produced beneath the connection structures, and the entire underside 1b of the wafer is coated with the glass layer 11, which is then removed in the region of the filled etching pits 6 in order for the ball grid arrays to be applied thereto, as shown in FIG. 9. After the wafer has been divided up along planes 9, modules with encapsulated semiconductor structures 2 are obtained.

The glass system of the layer 4 or 11 should form at least a binary system. Multicomponent systems are preferred.

Vapor-deposition glass which has the following composition, in percent by weight, has proven particularly suitable:

| Components | % by weight |
|---|---|
| $SiO_2$ | 75-85 |
| $B_2O_3$ | 10-15 |
| $Na_2O$ | 1-5 |
| $Li_2O$ | 0.1-1 |
| $K_2O$ | 0.1-1 |
| $Al_2O_3$ | 1-5 |

A preferred vapor-deposition glass of this type is glass 8329 produced by Schott, having the following composition:

| | | |
|---|---|---|
| $SiO_2$ | 84.1% | |
| $B_2O_3$ | 11.0% | |
| $Na_2O \approx$ | 2.0% | } 2.3% (in the layer ? 3.3%) |
| $K_2O \approx$ | 0.3% | |
| $Li_2O \approx$ | 0.3% | |
| $Al_2O_3 \approx$ | 2.6% | (in the layer <0.5%) |

The values given in parentheses represent the proportions by weight of the respective component in the vapor-deposited layer.

The electrical resistance is approximately $10^{10}$ Ω/cm (at 100° C.),
the refractive index is approximately 1.470,
the dielectric constant ε is approximately 4.7 (at 25° C., 1 MHz), and tgδ is approximately $45 \times 10^{-4}$ (at 25° C., 1 MHz).

A further group of suitable vapor-deposition glasses has the following composition, in percent by weight:

| Components: | % by weight |
|---|---|
| $SiO_2$ | 65-75 |
| $B_2O_3$ | 20-30 |
| $Na_2O$ | 0.1-1 |
| $Li_2O$ | 0.1-1 |
| $K_2O$ | 0.5-5 |
| $Al_2O_3$ | 0.5-5 |

A preferred vapor-deposition glass from this group is the glass G018-189 produced by Schott having the following composition:

| Components: | % by weight |
|---|---|
| $SiO_2$ | 71 |
| $B_2O_3$ | 26 |
| $Na_2O$ | 0.5 |
| $Li_2O$ | 0.5 |
| $K_2O$ | 1.0 |
| $Al_2O_3$ | 1.0 |

The glasses 8329 and G018-189 that are preferably used in particular have the properties as listed in the table below:

| Properties | 8329 | G018-189 |
|---|---|---|
| $\alpha_{20\text{-}300}[10^{-6} K^{-1}]$ | 2.75 | 3.2 |
| Density (g/cm³) | 2.201 | 2.12 |
| Transformation point [° C.] | 562 | 742 |
| Refractive index nd | 1.469 | 1.465 |
| Hydrolytic resistance class according to ISO 719 | 1 | 2 |
| Acid resistance class according to DIN 12 116 | 1 | 2 |
| Alkali resistance class according to DIN 52322 | 2 | 3 |
| Dielectric constant ε (25° C.) | 4.7 (1 MHz) | 3.9 (40 GHz) |
| tanδ (25° C.) | $45*10^{-4}$ (1 MHz) | $26*10^{-4}$ (40 GHz) |

To produce particular properties in the modules, it may be expedient to use glasses of different compositions for the glass layers on the top side and on the underside. It is also possible for a plurality of glasses having different properties, e.g. with regard to refractive index, density, E modulus, Knoop hardness, dielectric constant, tan δ, to be deposited successively on the substrate.

As an alternative to electron beam deposition, it is also possible to use other means for transferring materials which are deposited in glass form. For example, the vapor-coating material may be in a crucible which is heated by electron impact heating. Electron impact heating of this type is based on thermionic discharges which are accelerated onto the crucible in order to impact on the material to be vaporized with a predetermined kinetic energy. These processes likewise make it possible to produce glass layers without excessive thermal loading on the substrate on which the glass is deposited.

The following text present results of various tests carried out on vapor-deposited glass layers formed from glass 8329.

Figure 11:
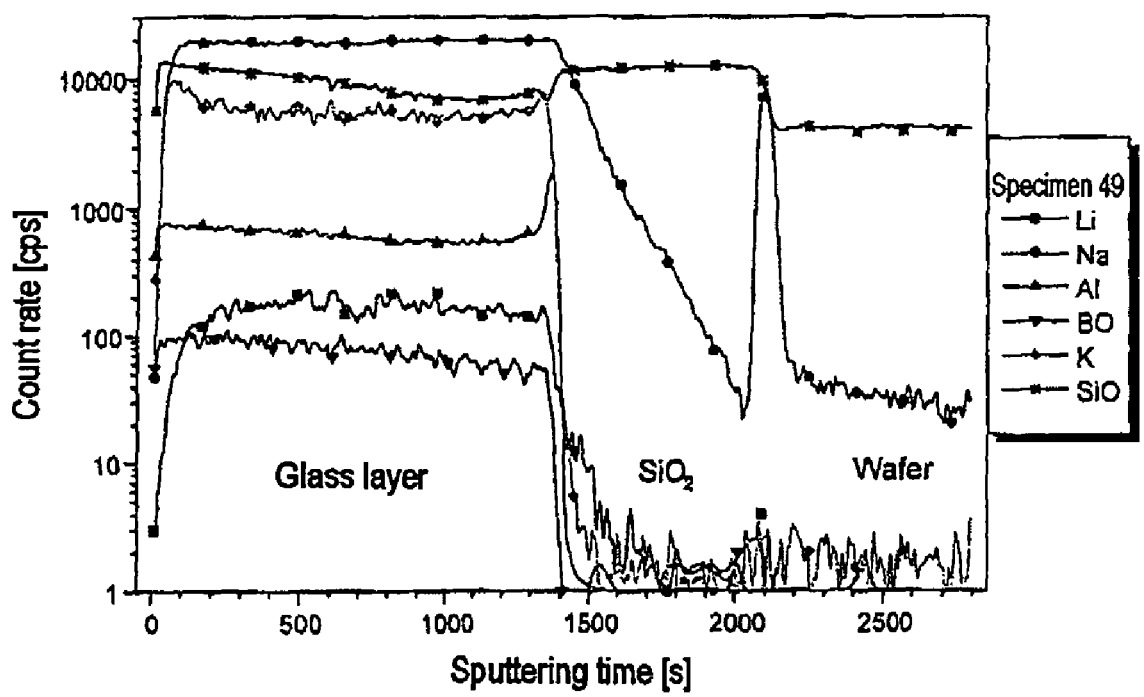
FIG. 11 shows results of a TOF-SIMS measurement.

FIG. 11 shows the results of a TOF-SIMS measurement, in which the count rate is plotted as a function of the sputtering time. The measurement characterizes the profile of the element concentrations in the direction perpendicular to the substrate surface. A thickness constancy for the glass frame of <1% of the layer thickness was determined.

Figure 12:
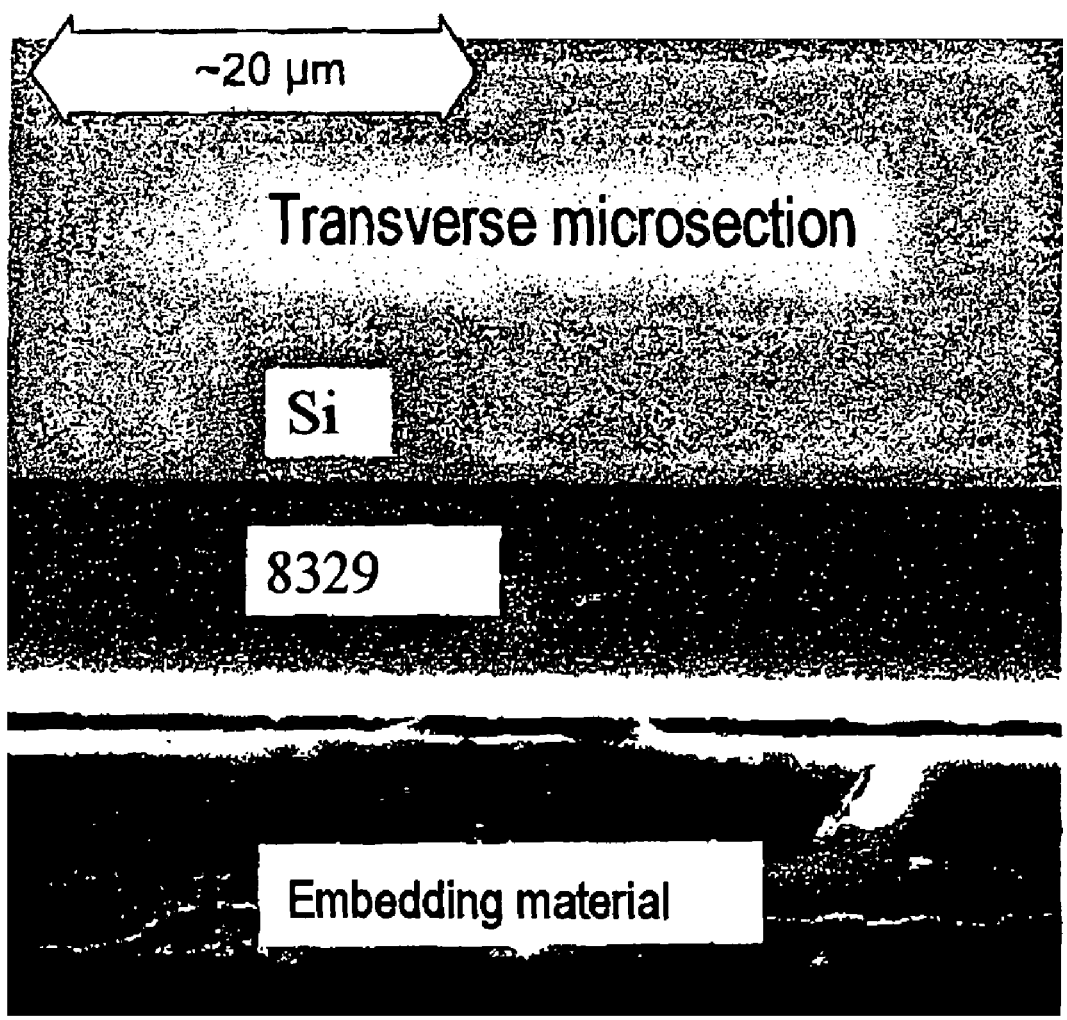
FIG. 12 shows an electron microscope transverse microsection image.

FIG. 12 shows an electron microscope transverse microsection image of a silicon substrate coated with the vapor-deposition glass 8329. The vapor-deposition glass and the surface of the silicon substrate are securely bonded to one another in a manner which is not released even by the transverse microsectioning operation involved in preparing the specimen.

Furthermore, resistance and stability measurements were carried out on a vapor-deposition glass layer formed from vapor-deposited glass 8329, in accordance with DIN/ISO. The results are given in Table 1.

TABLE 1

Specimen designation: 8329

| Water DIN ISO 719 Class | Consumption of HCl [ml/g] | $Na_2O$ equivalent [µg/g] | Comments |
|---|---|---|---|
| HGB 1 | 0.011 | 3 | none |
| Acid DIN 12116 Class | Material removal [mg/dm²] | Total surface area [cm²] | Comments/ visible changes |
| 1 W as material | 0.4 | 2 × 40 | unchanged |
| Alkali DIN ISO 695 Class | Material removal [mg/dm²] | Total surface area [cm²] | Comments/ visible changes |
| A 2 As material | 122 | 2 × 14 | unchanged |

The invention claimed is:

1. A process for forming a housing for electronic modules, comprising the steps of:
   locating at least one semiconductor structure on a first side of a semi-conductor substrate; and
   vapor-coating the first side with a glass layer, and, during the vapor-coating of the glass layer, ionizing a gas in a plasma to produce an ion beam and directing the ion beam onto the semiconductor substrate so as to additionally densify the glass layer as the glass layer is deposited, wherein the step of vapor coating is sufficient to provide the glass layer with a composition, in percent by weight, comprising: $SiO_2$ 75 to 85; $B_2O_3$ 10 to 15; $Na_2O$ 1 to 5; $Li_2O$ 0.1 to 1; $K_2O$ 0.1 to 1; and $Al_2O_3$ 1 to 5.

2. A process for forming a housing for electronic modules, comprising the steps of:
   locating at least one semiconductor structure on a first side of a semi-conductor substrate;
   vapor-coating the first side with a glass layer, and, during the vapor-coating of the glass layer, ionizing a gas in a plasma to produce an ion beam and directing the ion beam onto the semiconductor substrate so as to additionally densify the glass layer as the glass layer is deposited, wherein the step of vapor coating is sufficient to provide the glass layer with a composition, in percent by weight, comprising: $SiO_2$ 65 to 75; $B_2O_3$ 20 to 30; $Na_2O$ 0.1 to 1; $Li_2O$ 0.1 to 1; $K_2O$ 0.5 to 5; and $Al_2O_3$ 0.5 to 5.

3. A process for forming a housing for electronic modules, comprising the steps of:
   locating at least one semiconductor structure on a first side of a semi-conductor substrate;
   providing a vapor-deposition glass source and a plasma source in one arrangement;
   arranging the first substrate side in such a manner with respect to the vapor-deposition glass source that the first side can be vapor-coated; and
   generating a vapor by generating an electron beam and impinging the electron beam onto a glass target of the vapor-deposition glass source to vapor-coat the first side with a glass layer, and, during the vapor-coating of the glass layer, ionizing a gas in a plasma generated by the plasma source to produce an ion beam and directing the ion beam onto the semiconductor substrate so as to additionally densify the glass layer as the glass layer is deposited, wherein the glass layer has a composition, in percent by weight, comprising: $SiO_2$ 75 to 85; $B_2O_3$ 10 to 15; $Na_2O$ 1 to 5; $Li_2O$ 0.1 to 1; $K_2O$ 0.1 to 1; and $Al_2O_3$ 1 to 5, or comprising: $SiO_2$ 65 to 75; $B_2O_3$ 20 to 30; $Na_2O$ 0.1 to 1; $Li_2O$ 0.1 to 1; $K_2O$ 0.5 to 5; and $Al_2O_3$ 0.5 to 5.

4. The process as claimed in claim 3, further comprising selecting the glass target so that the glass layer comprises a mixed layer of inorganic and organic constituents.

5. The process as claimed in claim 3, further comprising maintaining the temperature below 300° C. during the vapor-coating of the glass layer.

6. The process as claimed in claim 3, further comprising maintaining the temperature below 150° C. during the vapor-coating of the glass layer.

7. A process for forming a housing for electronic modules, comprising the steps of:
   providing a substrate having one or more regions, the one or more regions comprising at least one semiconductor structure, the substrate having at least a first substrate side to be encapsulated and an underside, wherein the at least one semiconductor structure is located on the first substrate side;
   providing a vapor-deposition glass source and a plasma source in one arrangement;
   arranging the first substrate side in such a manner with respect to the vapor-deposition glass source that the first substrate side can be vapor-coated;
   vapor-coating the first substrate side with a glass layer, wherein the glass layer has a composition, in percent by weight, comprising: $SiO_2$ 75 to 85; $B_2O_3$ 10 to 15; $Na_2O$ 1 to 5; $Li_2O$ 0.1 to 1; $K_2O$ 0.1 to 1; and $Al_2O_3$ 1 to 5, or comprising: $SiO_2$ 65 to 75; $B_2O_3$ 20 to 30; $Na_2O$ 0.1 to 1; $Li_2O$ 0.1 to 1; $K_2O$ 0.5 to 5; and $Al_2O_3$ 0.5 to 5;
   wherein the step of vapor-coating comprises the steps of:
   generating vapor by generating an electron beam and impinging the electron beam onto a glass target of the vapor-deposition glass source,
   producing an ion beam by ionizing a gas in a plasma generated by the plasma source, and
   directing the ion beam onto the substrate during the vapor-coating so as to additionally densify the glass layer.

8. The process as claimed in claim 7, further comprising providing the substrate with a passivation layer on a second side that is on the opposite side from the first substrate side.

9. The process as claimed in claim 7, wherein the substrate comprises a wafer, the process further comprising packaging of components which still form part of the wafer.

10. The process as claimed in claim 7, further comprising vapor-coating a second substrate side with a glass layer.

11. The process as claimed in claim 7, wherein the vapor-deposition glass source generates at least a binary glass system.

12. The process as claimed claim 7, wherein the first substrate side is vapor-coated until the glass layer has a thickness in the range from 0.01 to 1000 µm on the first substrate side.

13. The process as claimed in claim 7, wherein the step of providing the vapor-deposition glass source comprises providing a reservoir having organic constituents, and converting the organic constituents into the vapor state through application of a vacuum or through heating so that during the vapor-coating mixed layers comprising inorganic and organic constituents can be formed on the first substrate side.

14. The process as claimed in claim 7, wherein the glass layer has a thickness in the range between 0.1 and 50 μm.

15. The process as claimed claim 7, wherein the glass layer has a thickness in the range between 50 and 200 μm.

16. The process as claimed in claim 7, wherein the glass target is a borosilicate glass comprising aluminum oxide and alkali metal oxide fractions.

17. The process as claimed in claim 7, wherein the glass layer has a coefficient of thermal expansion that is virtually equal to that of the substrate.

18. The process as claimed in claim 7, wherein the glass layer provides a hermetic seal.

19. The process as claimed in claim 7, further comprising vapor depositing a plurality of glass layers onto the substrate.

20. The process as claimed in claim 7, further comprising removing material from a second substrate side, the second substrate side being on the opposite side from the first substrate side.

21. The process as claimed in claim 7, wherein the substrate includes a wafer having a plurality of the structures wherein the process further comprises dividing the wafer to form a plurality of electronic modules which each have first encapsulated sides.

22. The process as claimed in claim 21, further comprising lithographing plastic layers on the substrate and removing the plastic layers from the underside.

23. The process as claimed in claim 22, further comprising vapor coating the underside with the glass layer after the plastic layers have been removed from the underside and dividing up the wafer so that the plurality of electronic modules are encapsulated on both sides.

24. The process as claimed in claim 23, wherein the glass layer on the underside has a thickness in the range from 1 to 50 μm.

25. The process as claimed in claim 7, further comprising applying a layer of plastic above the glass layer.

26. The process according to claim 7, wherein the semiconductor structure comprises an integrated circuit.

* * * * *